United States Patent
Variyam et al.

(12)

(10) Patent No.: US 6,661,266 B1
(45) Date of Patent: Dec. 9, 2003

(54) ALL DIGITAL BUILT-IN SELF-TEST CIRCUIT FOR PHASE-LOCKED LOOPS

(75) Inventors: Pramodchandran N. Variyam, Plano, TX (US); Hari Balachandran, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 554 days.

(21) Appl. No.: 09/708,994

(22) Filed: Nov. 8, 2000

(51) Int. Cl.$^7$ ................................................ H03L 7/06
(52) U.S. Cl. ........................ 327/159; 327/20; 327/48; 714/30
(58) Field of Search ................................ 327/156, 158, 327/159, 160, 161, 162, 163, 18–20, 31, 37, 38, 47–49; 326/16; 375/226, 224, 371, 376; 714/30, 48, 49, 54, 703; 331/11, 25, 1 A, 1 R

(56) References Cited

U.S. PATENT DOCUMENTS

| | | | |
|---|---|---|---|
| 5,381,085 A | | 1/1995 | Fischer .................... 324/76.48 |
| 5,574,406 A | * | 11/1996 | Sauer et al. .................. 331/11 |
| 5,574,886 A | | 11/1996 | Koike et al. ................. 395/500 |
| 5,663,991 A | | 9/1997 | Kelkar et al. ................ 375/376 |
| 5,889,435 A | * | 3/1999 | Smith et al. ................ 331/1 A |
| 6,295,315 B1 | * | 9/2001 | Frisch et al. ................ 375/226 |
| 6,356,514 B1 | * | 3/2002 | Wells et al. ................. 368/113 |
| 6,396,889 B1 | * | 5/2002 | Sunter et al. ............... 375/376 |
| 6,557,117 B1 | * | 4/2003 | Wu et al. ...................... 714/30 |

OTHER PUBLICATIONS

BIST for Phase–Locked Loops in Digital Applications; Stephe Sunter et al.; 1999 IEEE ITC International Test Conference; pp. 532–540

* cited by examiner

Primary Examiner—Timothy P. Callahan
Assistant Examiner—Hai L. Nguyen
(74) Attorney, Agent, or Firm—April M. Mosby; Wade James Brady, III; Frederick J. Telecky, Jr.

(57) ABSTRACT

In general, a built-in self test circuit and method is provided that measures error in any periodic signal and, particularly, a Phase Lock Loop (PLL) output clock signal. The circuit includes a short-pulse generator that generates a short-pulse signal having the same frequency as the phase lock loop output clock signal. Accordingly, a delay chain, including a plurality of delay elements, generates N delayed pulses from the short-pulse signal. A hit-pulse generator receives the N delayed pulses and compares each delayed pulse with the phase lock loop output clock signal $2^K$ times, such that the hit-pulse generator also generates a hit-pulse when both signals are high. It also generates a hit count which represents the number of hit-pulses. After each of the N delayed pulses are compared with the clock signal $2_k$ times, a comparator compares a predetermined set of threshold values corresponding to the cumulative distribution of jitter for a PLL clock signal with the hit count. When the hit count and one of the predetermined set of threshold values are equivalent, the storage unit stores the value of N. A processing unit calculates the error of the PLL clock signal using each stored value of N which directly relates to the cumulative distribution of jitter found in the PLL clock signal.

20 Claims, 6 Drawing Sheets

ALL DIGITAL BUILT-IN SELF-TEST CIRCUIT FOR PHASE-LOCKED LOOPS

FIELD OF THE INVENTION

The present invention relates to built-in self test circuitry (BIST), and, more particularly, to an all digital built-in self-test circuit for phase-locked loops.

BACKGROUND OF THE INVENTION

Phase-locked Loops (PLLs) are used for a variety of applications in mixed-signal and digital systems. Some of the typical applications include (1) generating clocks of different frequencies from a reference clock, (2) generating a low jitter clock, (3) extracting a data-synchronous clock from serially communicated data, and (4) generating a stable clock from a noisy clock signal. Tightly controlled performance parameters are a must for satisfactory operation of mixed-signal or digital circuitry in which the PLL is embedded. Specifically, when PLLs are used as building blocks to provide clock signals in mixed-signal circuitry, the clock signals generated by the PLL must be stable.

Ideally, as shown in FIG. 1, pulse width, P, period, T, and frequency of a clock signal should remain the same from cycle to cycle. Due to noise generated in and in close proximity to the PLL circuit, however, the period can vary around a mean value. Fluctuation of the period of a clock signal relative to an ideal base is known as jitter. Since noise is the cause of this fluctuation, one may assume that jitter is a random statistical phenomena, Gaussian in nature. FIG. 2 illustrates a jittery clock compared with an ideal jitter-free clock.

Assuming that n period measurements are done on a clock, measured periods can be represented by $[T_1, T_2, \ldots T_n]$. The mean period of the clock (T) is given by the equation:

$$T = \frac{\sum_{i=1}^{n} T_i}{n} \qquad (1)$$

The standard deviation of the period is known as root mean square (RMS) jitter RMS jitter is given by the equation:

$$J_{rms} = \sqrt{\frac{\sum_{i=1}^{n} (T_i - T)^2}{n}} \qquad (2)$$

Peak-to-peak jitter is given by the equation:

$$J_{pktopk} = \max[T_1, \ldots, T_n] - \min[T_1, \ldots, T_n] \qquad (3)$$

Jitter and duty ratio are two important parameters of the PLL output clock; where duty ratio of the clock signal is defined as the ratio of pulse width to the period:

$$\frac{P}{T} \qquad (4)$$

Many commercial automatic test equipment (ATE) like Teradyne's™ A580, Catalyst etc. incorporate a time jitter digitizer (TJD) circuit to measure these parameters during production testing. The TJD circuit can capture the times at which a particular event such as rising or falling of a clock edge takes place very accurately. These events are stored in an array which can be post-processed using equations 1–4 to calculate various clock parameters. Various methods of measuring the clock parameters using the TJD circuit are described in detail in "Test Technique Note MS30: Analog Jitter Demodulation," Teradyne Inc. (1991), which is incorporated by reference herein.

Although TJD circuits are fairly accurate in the sub-nanosecond range, they are expensive. Hence, it is not feasible to implement these TJD circuits in low-cost production testers, such as Texas Instrument's™ V-series low-cost production testers. Accordingly, the TJD circuit is not commonly found in low-cost production testers.

Another approach uses the incorporation of built-in-self-test (BIST) circuitry. A BIST circuit implements the functions of an ATE on-chip by applying the test signal to the circuit under test (CUT) and analyzing its response to verify if the circuit is functioning properly. Due to the advancements in the process technology, the cost of implementing more functions on an integrated circuit is decreasing. The use of BIST circuitry leverages off of this advantage by reducing the production test time and allowing the use of low-cost testers in production testing. Thereby, BIST circuitry reduces the production test cost of integrated circuits.

Another approach, disclosed in U.S. Pat. No. 5,663,991 which is incorporated by reference herein, describes a BIST scheme to measure the peak-to-peak jitter of PLL circuit. A low-jitter clock is used as a reference to characterize the jitter of the PLL. A delay chain is realized using a string of inverters to delay the reference clock and find the position of the jittery PLL clock edge. As is required, a calibration system including analog parts controls the delays of the inverters. Since parametric specifications of the analog parts can. deviate from the expected values due to process variations, to guarantee accurate measurement of the PLL jitter, the calibration circuitry must be tested to determine whether it meets its specifications. Unfortunately, this patent does not include circuitry or a method of testing the calibration circuitry. Thus, accuracy or the lack thereof tends to be an issue with the present approach. Moreover this approach requires a low-jitter clock that is used as a reference clock for characterizing the jitter of the PLL.

Sunter et al. presents another BIST scheme for measuring PLL specifications in the publication entitled "BIST for Phase-Locked Loops in Digtal Applications," International Test Conference, IEEE Computer Society Press, p. 532–540 (1999). They also incorporate the use of a low-jitter clock as a reference to measure PLL jitter. The BIST scheme uses a string of inverters, 10–24, to delay the reference clock as shown in FIG. 3. A portion of the delay chain is identified using digital logic such that the total delay of this portion is equal to peak-to-peak or the RMS jitter of the PLL. Two ring oscillators are then formed by connecting (1) all the inverters, 10–16, from the beginning of the delay chain to the beginning of the identified portion of the delay chain ($T_1$) or (2) all the inverters, 10–24, from the beginning of the delay chain to the end of the identified portion of the delay chain ($T_2$). This BIST scheme provides the measurement of the period of these ring oscillators where the peak-to-peak and RMS jitter is given by the difference between these periods. The delays of the inverters, however, during jitter measurement can be different from that when connected as ring oscillator due to interaction between the delay chain and the PLL. Thus, this arrangement has a tendency to lead to inaccurate jitter measurements.

Furthermore, the BIST schemes described above assume the availability of a low-jitter reference clock. Yet, low-cost testers often do not include low-jitter clocks. Moreover, when low-jitter reference clocks are used, the clock signal must be routed carefully to the PLL since jitter can be injected into the clock signal in route to the PLL. Additionally, using on-chip oscillators for generating the clock signal is not recommended since its frequency and jitter can affect the BIST results. Furthermore, other proposed solutions are cost prohibitive and require significant vendor intrusion into one's design environment.

Thus, there is a need for a cost efficient, all digital BIST scheme for measuring PLL jitter in the sub-nano seconds that does not include external reference clocks nor on-chip oscillators.

SUMMARY OF THE INVENTION

To address the above-discussed deficiencies of the BIST circuits that measure jitter, the present invention teaches an integrated circuit chip having a built-in circuit for measuring error of a phase lock loop output clock signal. The circuit includes a short-pulse generator that generates a short-pulse signal having the same pulse width as the phase lock loop output clock signal. Accordingly, a delay chain, including a plurality of delay elements, generates N delayed pulses from the short-pulse signal. A hit-pulse generator receives the N delayed pulses and compares each delayed pulse with the phase lock loop output clock signal $2^K$ times, such that the hit-pulse generator also generates a hit-pulse when both signals are high. It also generates a hit count which represents the number of hit-pulses. After each of the N delayed pulses are compared with the clock signal $2^k$ times, a comparator compares a predetermined set of threshold values corresponding to the cumulative distribution of jitter for a PLL clock signal with the hit count. When the hit count and one of the predetermined set of threshold values are equivalent, the storage unit stores the value of N. A processing unit calculates the error of the PLL clock signal using each stored value of N which directly relates to the cumulative distribution of jitter found in the PLL clock signal.

Advantages of the present invention include but are not limited to an efficient, modular, testable BIST circuit which utilizes less time to test. Furthermore, since the BIST solution in accordance with the present invention is all-digital, it can be tested using standard digital test techniques. For a further savings, this BIST circuit is capable of running in tandem with other tests. Thus, a considerable amount of production test time can be saved for mixed-signal integrated circuits which use expensive mixed-signal ATEs.

The most significant advantage of the present invention is that the external reference clock is not required. Thus, a BIST circuit in accordance with the present invention provides PLL testing in low-cost testers which aligns with the present and future technological needs of semiconductor testing. Particularly, since semiconductor manufacturers are advancing towards low cost testing and low cost testers where external reference clocks having low jitter may not be readily available.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
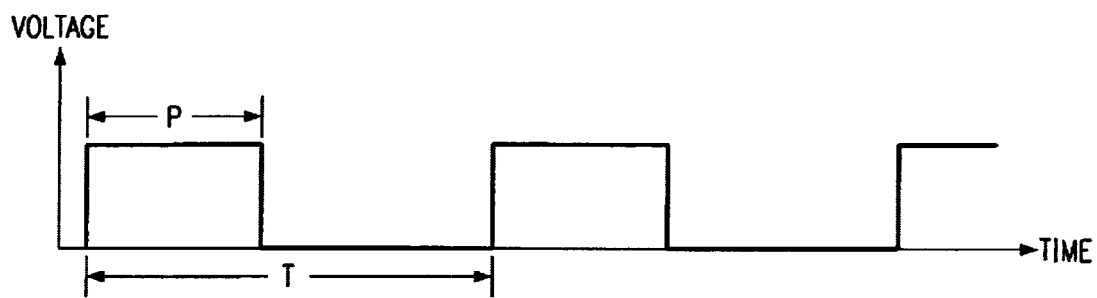
FIG. 1 is a timing diagram of a clock signal without jitter.
Figure 2:
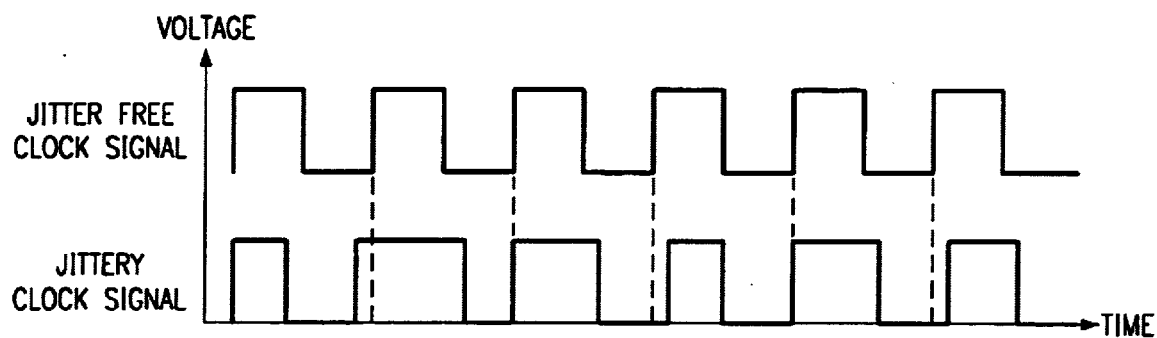
FIG. 2 is a timing diagram of two clock signals, one with jitter and one without jitter.
Figure 3:
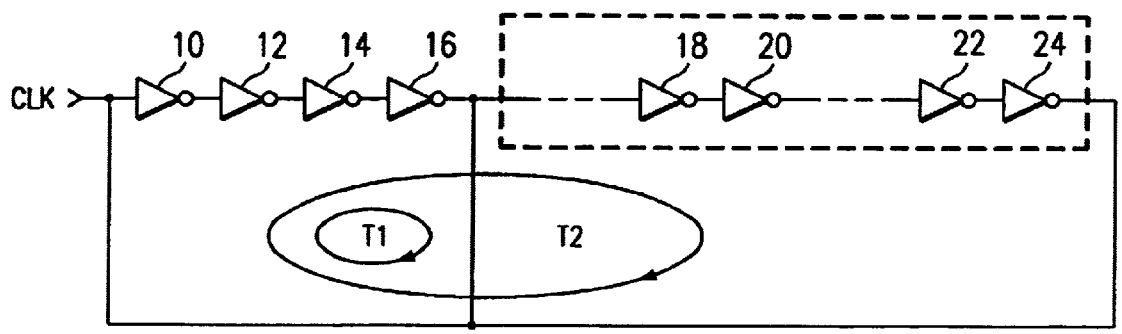
FIG. 3 is a known embodiment of a BIST circuit to measure PLL jitter.
Figure 4:
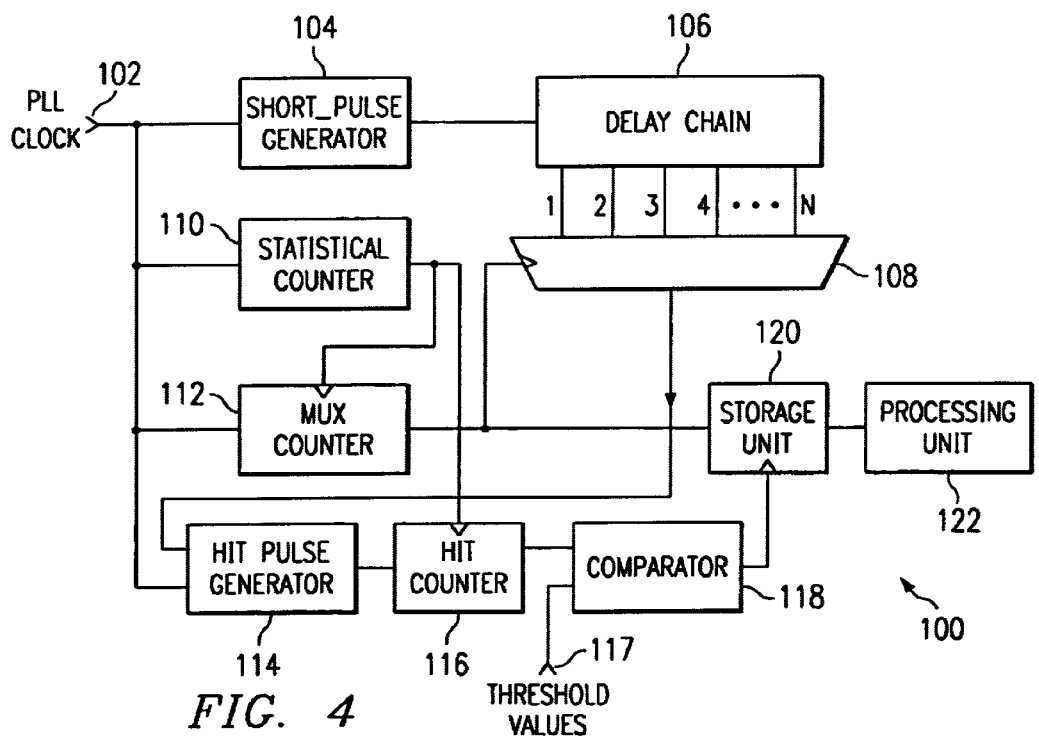
FIG. 4 is an embodiment of the BIST circuit in accordance with the present invention.

FIG. 4 illustrates an embodiment of an all digital built-in self-test (BIST) circuit for phase locked loops (PLL) for measuring PLL jitter in sub-nano seconds constructed in accordance with the teachings of the present invention. Circuit 100 includes a short-pulse generator 104 which generates a short-pulse having the same frequency as the PLL clock which is fed into input 102.

A delay chain 106 includes a plurality of delay elements for creating N delayed pulses from the short-pulse signal as shown. A multiplexer 108 receives the N delayed pulses into its inputs. A multiplexer counter 112, having a count from 1 to N, controls the multiplexer 108 such that the multiplexer count determines which of the N delayed pulses appears at the output of the multiplexer 108. A hit-pulse generator 114 receives the multiplexer 108 output signal and the phase lock loop output clock signal and generates a hit-pulse when both signals are high. A hit counter 116 counts the number of hit-pulses; thereby generating a hit-count. A comparator 118 compares a pre-determined set of threshold values with the hit-count. When the hit-count and one of the pre-determined set of threshold values are equivalent, the comparator 118 sends a signal to a storage unit 120 to store the value of the multiplexer counter 112. A statistical counter 110, having a count from 1 to $2^k$, couples to the multiplexer counter 112 and the hit-pulse generator 114 such that each of the N delayed pulses is compared with phase lock loop output clock signal $2^k$ times. A processing unit 122 couples to the storage unit 120 to calculate error of a phase lock loop output clock signal including the root means square of jitter for the phase lock loop output clock signal divided by the period, the peak-to-peak jitter for the phase lock loop output clock signal divided by the period and the duty ratio.

Figure 5:
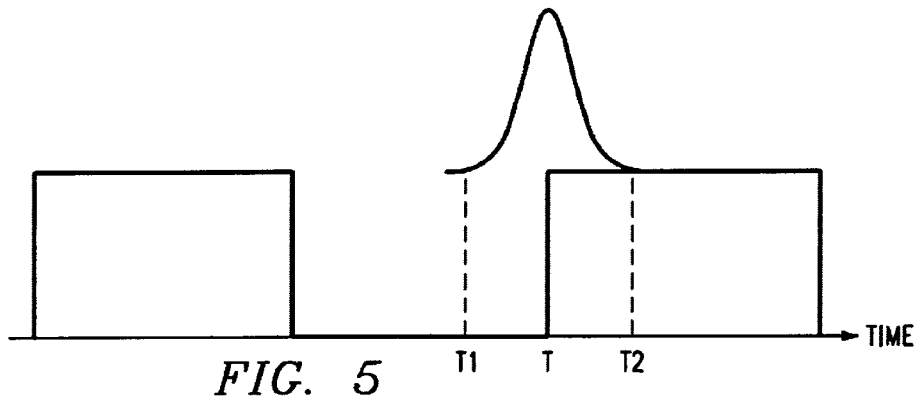
FIG. 5 is a timing diagram demonstrating the Gaussian distribution of jitter in a clock signal.

In operation, circuit 100 uses the probability distribution of jitter and predetermined statistical values to make a determination of the error of the phase lock loop clock signal. Specifically, as shown in FIG. 5, it it assumed that jitter follows a Gaussian distribution. Therefore, the rising edge of the clock signal can be anywhere between T1 and T2. The probability of the edge occurring at any time is given by the probability distribution of the jitter. If the jitter is gaussian, then the probability distribution is normal with mean T and the standard deviation is equal to the RMS jitter.

Figure 6:
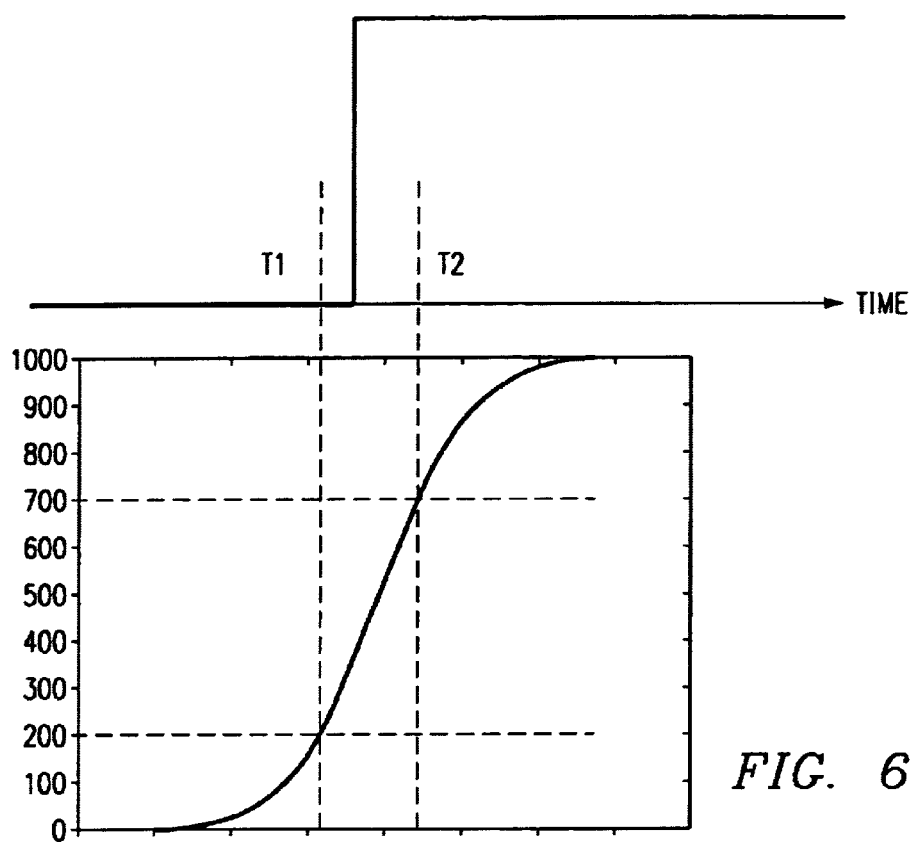
FIG. 6 is a timing diagram comparison between a signal with jitter and the cumulative distribution function.

FIG. 6 illustrates that the number of times the clock is a "high" is proportional to the cumulative distribution function of the jitter probability distribution. Assuming the clock is observed for 1000 clock cycles, at time T1, the clock signal is "high" 200 times and the clock signal is "low" 800 times. At time T2, the clock signal is "high" 700 times and the clock signal is "low" 300 times. Thus, by use of the number of delays in the delay chain 106, the cumulative probability function of the jitter distribution can be derived.

Figure 7:
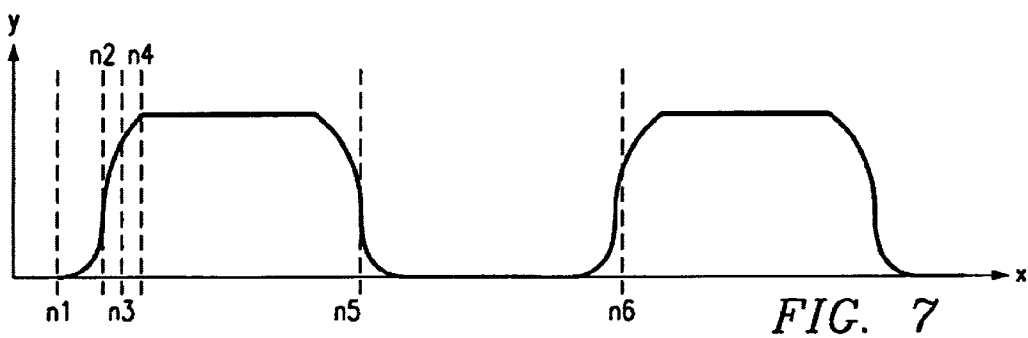
FIG. 7 is a cumulative distribution of PLL jitter.

FIG. 7 displays a plot of the number of times the clock is "high" at the end of each delay and against the number of delays up to that point. Use of the delay chain 106 with delays of equal amounts provides that the delay of a portion of the chain will be proportional to the number of delays in that portion. Assuming that the delay point is sampled 1000 times, point n, represents the number of delays up to a point where the first "high" has occurred and point $n_2$ represents the number of delays up to a point where 500 "highs" have occurred. Point $n_3$ represents the number of delays up to a point where 841 "highs" have occurred and point $n_4$ represents the number of delays up to a point where 1000 "highs" have occurred. Points $n_5$ and $n_6$ are the number of delays up to a point where 500 "highs" have occurred. Assuming gaussian jitter distribution, various clock parameters are given by these equations:

$$\frac{J_{rms}}{Period} = \frac{n_3 - n_2}{n_6 - n_2} \quad (5)$$

$$\frac{J_{pktopk}}{Period} = \frac{n_4 - n_1}{n_6 - n_2} \quad (6)$$

$$DutyRatio = \frac{n_5 - n_2}{n_6 - n_2} \quad (7)$$

Although one cannot control the individual buffer delays accurately, the ratio of the buffer delays can be controlled. Hence, the clock parameters are obtained as a ratio to the period. If it is necessary to convert the ratio to absolute time units, the mean PLL clock period can be measured using an ATE.

Given the fact that the statistical counter 110 having a count from 1 to $2^k$ is implemented so that for each of the N delayed short-pulse signals sampling occurs $2^k$ times, values $n_1$–$n_6$ are related to $2^k$ as displayed in the table below:

TABLE 1

| Threshold | Content of Mux Counter | Comments |
| --- | --- | --- |
| 1 | $n_1$ | To measure peak-to-peak jitter |
| $2^k \times 0.5$ | $n_2$ | To measure duty ratio and period |
| $2^k \times 0.84$ | $n_3$ | To measure RMS jitter |
| $2^k$ | $n_4$ | To measure peak-to-peak jitter |
| $2^k \times 0.5$ | $n_5$ | To measure duty ratio |
| $2^k \times 0.5$ | $n_6$ | To measure period |

When statistical counter 110 reaches its maximum value, a signal is issued that resets the hit counter 116 and increments multiplexer counter 112 to select the next delay buffer output.

Advantages of the present invention include but are not limited to no requirement for a low-jitter reference clock nor ring oscillators. Since previous techniques measured edge jitter of the PLL, where edge jitter is defined as the jitter relative to a perfectly jitter free reference clock. Thus, the present invention provides more accurate measurement results than previous techniques.

Figure 8:
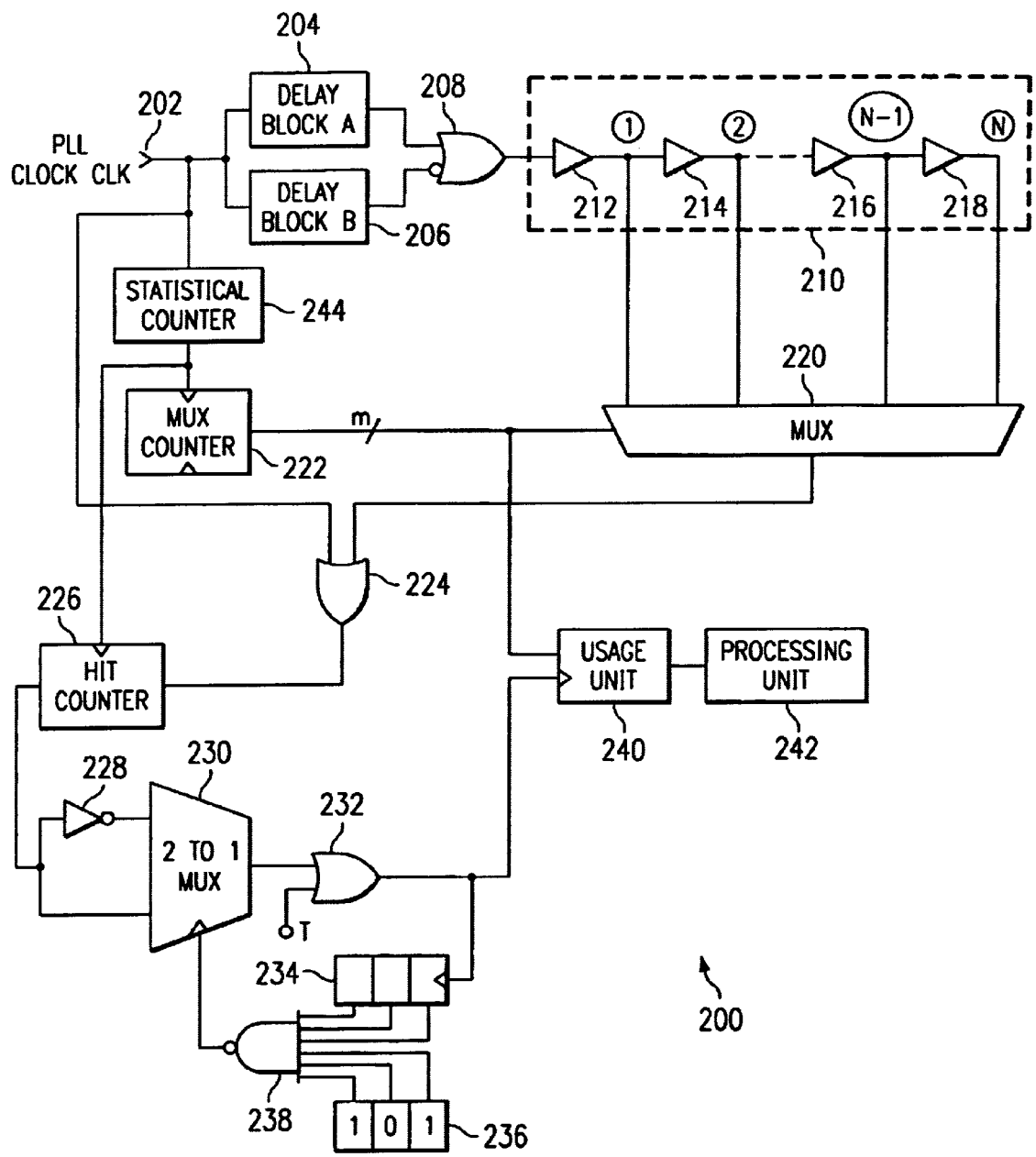
FIG. 8 is another embodiment of the BIST circuit in accordance with the present invention.
Figure 10:
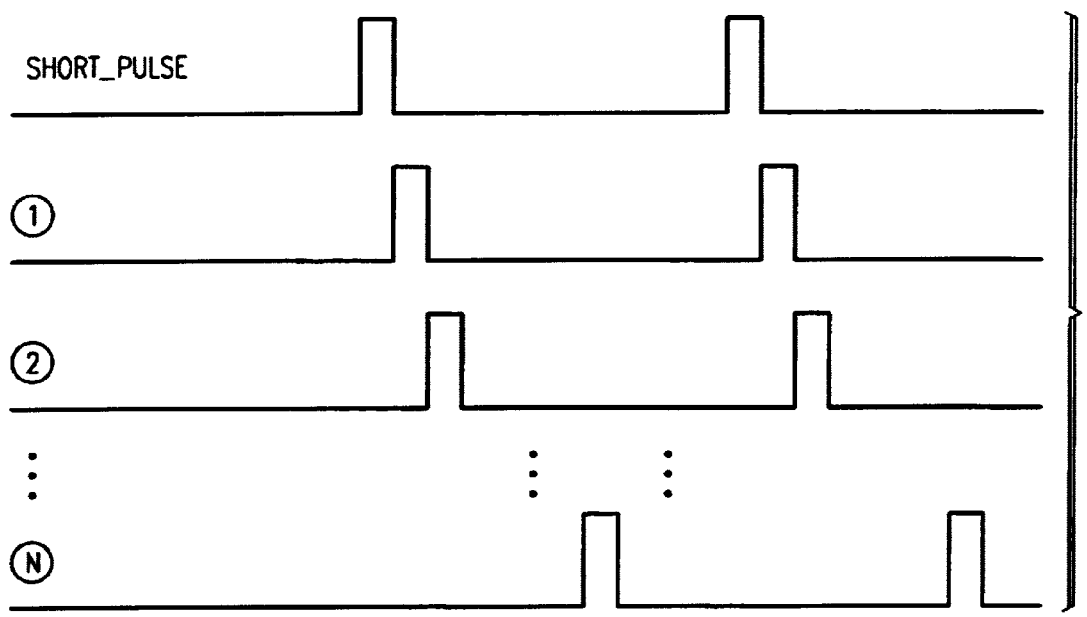
FIG. 10 is a timing diagram for the short pulse signals generated by the delay chain.

FIG. 8 illustrates another embodiment of an all digital built-in self-test (BIST) circuit for phase locked loops (PLL) for measuring PLL jitter in sub-nano seconds constructed in accordance with the teachings of the present invention. Circuit 200 includes a short-pulse generator comprising delay block A 204 and delay block B 206 connected to an AND gate 208. It generates a short-pulse having the same frequency as the PLL clock which is fed into input 202. A delay chain 210 includes a plurality of delay elements 212–218 for creating N delayed pulses from the short-pulse signal as shown.

A multiplexer 220 receives the N delayed pulses into its inputs. A multiplexer counter 222, having a count from 1 to N, controls the multiplexer 220 such that the multiplexer count determines which of the N delayed pulses appears at the output of the multiplexer 220. AND gate 224 receives the multiplexer 108 output signal and the phase lock loop output clock signal and generates a hit-pulse when both signals are high. A hit counter 226 counts the number of hit-pulses; thereby generating a hit-count. An inverter 228 receives the hit count. The inverted and non-inverted hit count are fed into a second multiplexer 230. The output of the multiplexer 230 couples into an AND gate 232 along with a predetermined set of threshold values such that when the hit count matches the predetermined threshold a control signal is sent to a storage unit 240 to store the multiplexer count 222.

The control signal is also sent to a register 234 and compared with another register 236 having the value of the sample that will need to be inverted (in this case 5 or the binary number '101'). AND gate 238 compares both values in registers 234 and 236. When the output of AND gate 238 is "high", the inverted hit count is passed through the multiplexer 230. Comparator 118 compares a predetermined set of threshold values with the hit-count. A statistical counter 244, having a count from 1 to $2^k$, couples to the multiplexer counter 222 and AND gate 224 such that each of the N delayed pulses is compared with phase lock loop output clock signal $2^k$ times. A processing unit 242 couples to the storage unit 240 to calculate error of a phase lock loop output clock signal including the root means square of jitter for the phase lock loop output clock signal divided by the period, the peak-to-peak jitter for the phase lock loop output clock signal divided by the period and the duty ratio.

In operation, a short pulse is generated from the PLL output using delay block A 204 and delay block B 206 connected to an AND gate 208. The delay of each block, 204 and 206, is pre-determined during the design phase of the PLL and circuit 200. The delay of block B is δ higher than the delay of block A. Delta δ is typically required to be equal to the 1/100th of the period. Thus, for example, if the period of the PLL clock under test is 100 ns, the delta will be 1 ns. Following this hypothetical, the delay of block A 204 may be 75 ns and, hence, the delay of block B 206 will be 76 ns (75 ns+1 ns). As shown, these two delayed clocks are logically gated to generate the short-pulse signal. The truth table of the logical block that generates the short pulses from the delayed clocks is shown in the table below:

TABLE 2

| CLKA | CLKB | SHORT_PULSE |
| --- | --- | --- |
| 0 | 0 | 0 |
| 0 | 1 | 0 |
| 1 | 0 | 1 |
| 1 | 1 | 0 |

Figure 9:
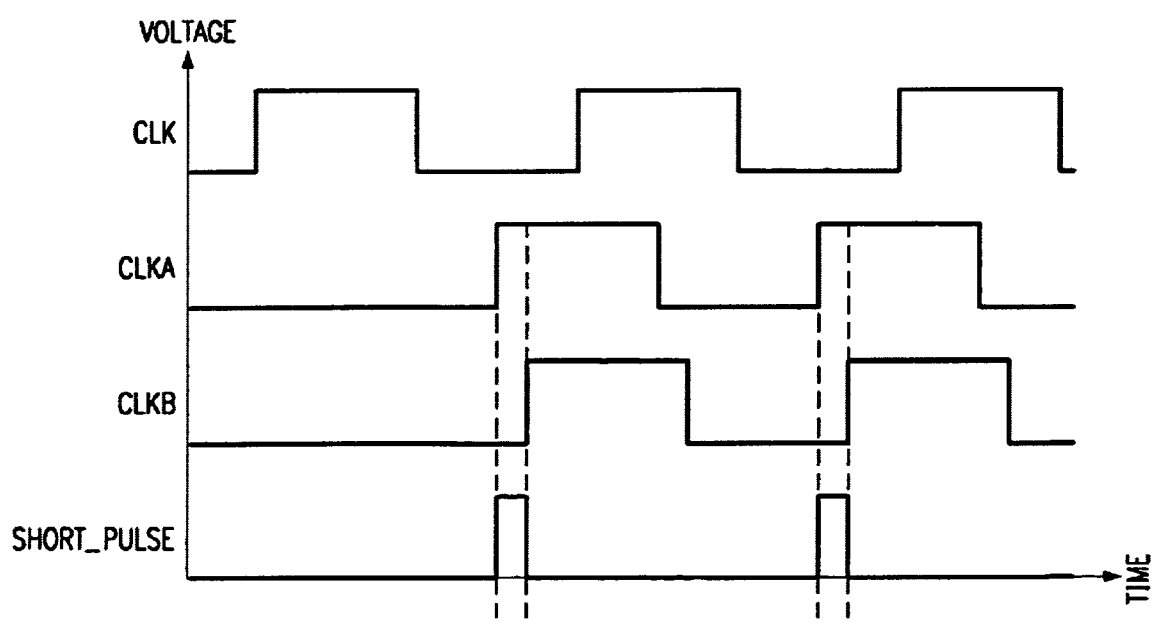
FIG. 9 is a timing diagram for four signals in the BIST circuit of FIG. 8.

FIG. 9 shows various waveforms from the short-pulse generator of FIG. 8.

Figure 11:
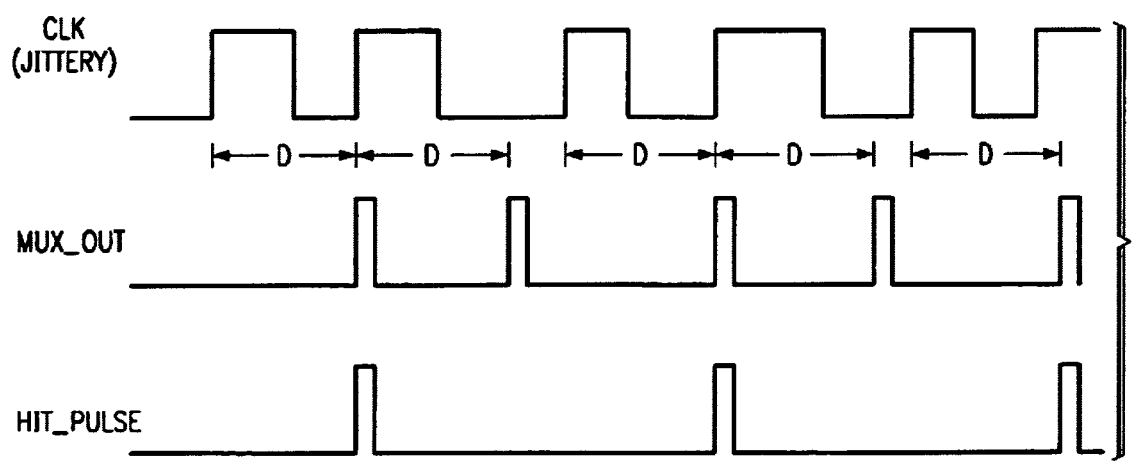
FIG. 11 is a timing diagram for three additional signals in the BIST circuit of FIG. 8.

The short pulses are delayed by passing them through the delay chain 210 of non-inverting buffers. Delay chain 210 can also be realized using a transmission line structure in the IC. FIG. 11 displays N delayed short-pulse signals. The individual output of each buffer can be selected using a multiplexer 220. The control signal for multiplexer 220 is provided by an m-bit counter 222 where: m=⌈$\log_2 N$⌉. Depending on the control signal provided to the multiplexer 220, appropriate output of the buffer is propagated to the output of the multiplexer 220. The output of the multiplexer 220 is compared against the PLL clock output using AND gate 224. If the PLL clock signal is high during the pulse, the hit-pulse signal is set high, which increments hit counter 226.

A statistical counter 244 having a count from 1 to $2^k$ is implemented so that for each of the N delayed short-pulse signals sampling occurs $2^k$ times. The value for $2^k$ is set such that a large number of clock cycles is used to determine the characteristics of the jitter distribution. It is recommended that the statistical counter 244 be at least a 10-bit counter. When statistical counter 244 reaches its maximum value, a signal STAT_MAX is issued which resets the hit counter 226 and increments the mux counter 222 to select the next delay buffer output.

FIG. 11 displays a timing diagram for the operation of this part of circuit 200. As shown pulses generated from the rising edge of the jittery PLL clock CLK are delayed by a constant delay D using the delay chain 210. AND gate 224 generates a signal HIT_PULSE if CLK is high during the delayed pules. As shown, due to jitter, only during 3 pulses of MUX_OUT is CLK is high and during the other two pulses CLK is low. Hence, hit counter 226 will be incremented only 3 times during the 5 clock pulses. If this process is done until the statistical counter 244 saturates, the contents of the hit counter 226 will be proportional to the cumulative distribution function of the jitter.

When statistical counter reaches it maximum value, $2^K$, setting STAT_MAX high, the contents of the hit counter 226 is compared with a pre-determined threshold T. This pre-determined threshold T is based on the theory explained above regarding FIG. 7 and Table 1. If the value of the hit counter 226 is equal or greater than the pre-determined threshold T, then the value of the multiplexer counter 222 is stored in the storage unit 240. To measure three clock parameters, namely, RMS jitter, peak-to-peak jitter and duty ratio, the hit counter 226 is sequentially compared with 6 different thresholds, as shown in Table 1. During the falling edge transition, however, where $n_5$ correlates to $2^k \times 0.5$ hits, the content of the hit counter 226 is inverted before comparing it with the threshold T. Assuming that the statistical counter has k bits, these thresholds are given in Table 1. The recorded values of the multiplexer counter 222 can be scanned out to calculate the clock parameters using equations 5–7 listed above.

Advantages of the present invention include but are not limited to an efficient, modular, testable BIST circuit which utilizes less time to test. Typically, the test time for measuring jitter in the range of 10s of pico seconds using TJD in Teradyne's™ mixed-signal testers is estimated to be approximately 100 ms. The test time for the BIST scheme according to the present invention is approximately 200× 2000 clock cycles. Assuming 20 MHZ clock, this translates to 20 ms.

The most significant advantage of the present invention is that the external reference clock is not required. Thus, a BIST circuit in accordance with the present invention provides PLL testing in low-cost testers which aligns with the present and future technological needs of semiconductor testing. Particularly, since semiconductor manufacturers are advancing towards low cost testing and low cost testers where external reference clocks having low jitter are not be readily available.

A common concern about any BIST scheme is how to test the BIST circuit. Since the BIST solution in accordance with the present invention is all-digital, it can be tested using standard digital test techniques. If there is a parametric failure such as a lumped delay in the delay chain 210, path delay testing which can verify delays in 100s of pico seconds may be implemented to detect this failure.

For a further savings, this BIST circuit is capable of running in tandem with other tests. Thus, a considerable amount of production test time can be saved for mixed-signal integrated circuits which use expensive mixed-signal ATEs.

Moreover, a BIST circuit in accordance with the present invention facilitates PLL testing on low-cost testers. Many ICs in ASIC are currently tested using V-series or VLCLT testers. These testers cannot measure PLL parameters like jitter and duty ratio. They just measure the PLL frequency during production testing. As the frequency of the PLL clock signals required for ICs increase, PLL specifications like jitter and duty ratio will become critical to the performance of these ICs. BIST circuits according to the present invention will help them to test their PLLs for jitter and duty ratio using low-cost testers.

At a specific temperature and supply voltage conditions the ratio of delays in the delay chain 210 can be controlled tightly. Assuming that the ratio can be controlled up to 6-bits accurately, jitter will be equal to 10 buffer delays and the clock period will be equal to 200 buffer delays. Thereby, the error in jitter measurement will only be 3.17% compared to other approaches that estimate an error jitter measurement of ~50% in the pico-second range.

Figure 12:
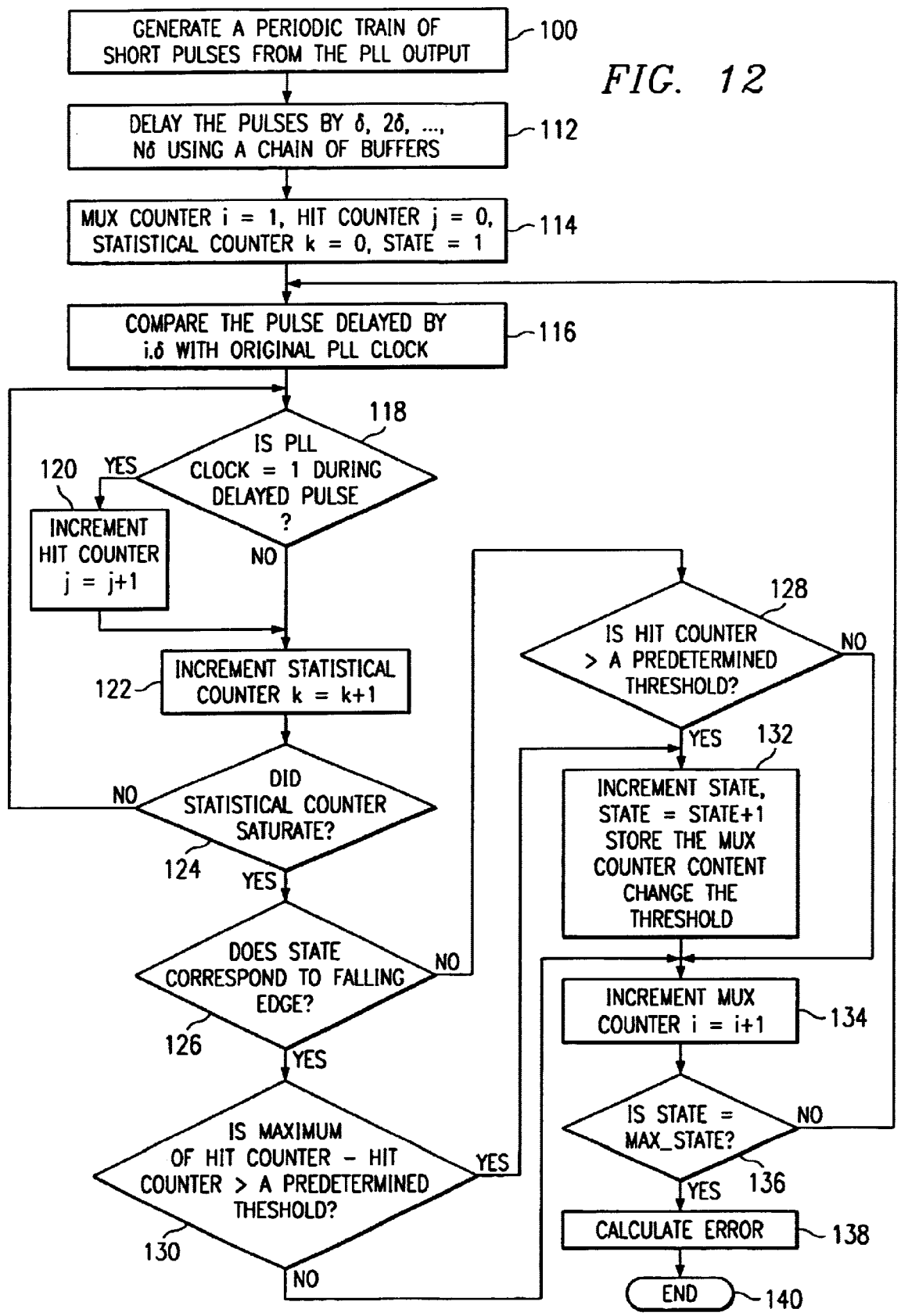
FIG. 12 is the flow chart for the process of measuring jitter in a clock signal in accordance with the present invention.

FIG. 12 illustrates a method for measuring jitter of phase locked loop (PLL) clocks in sub-nano seconds in accordance with the teachings of the present invention. In step 100, a periodic train of short pulses from the PLL output is generated. Step 112 dictates that series of N delayed signals should be generated from the short pulse signal of step 100. In step 114, variables are set for the multiplexer counter, the hit counter, the statistical counter and state as shown. In step 116 the original clock signal is compared with one of the N delayed signals. If, as indicated by step 118, both the clock signal and the delayed pulse are high, a hit signal is generated and, as is shown in step 120, the hit counter is incremented. In step 122 the statistical counter is incremented. Step 124 determines whether the maximum number of the statistical count has been reached. If not, steps 118–124, repeat. If so, step 126 will determine if the state correspondes to the falling edge of the cummulative distribution of jitter in the clock signal. In the present embodiment, this state corresponds with the fifth sample point, $n_5$ (see FIG. 7). If so, the hit count must be inverted prior to comparison with a predetermined threshold as indicated in step 130. Otherwise, the hit count is compared with the predetermined threshold as indicated in step 128. If the predetermined threshold has not been reached the multiplexer count and the state is incremented as shown in step 134. If the predetermined threshold has been exceeded, step 132 dictates that the state is incremented, the multiplexer count is stored in a storage unit and the threshold is changed to the next predetermined value. Afterwards, in step 134, the multiplexer count and the state are incremented as well. During step 136 the state variable is compared to the maximum value of states for measuring jitter. In the present embodiment, this maximum value is seven, corresponding to point $n_7$ (see FIG. 7). If the maximum value is reached, the error is calculated in step 138 and the subroutine ends in step 140; otherwise, steps 116–136 are repeated.

In summary, in steps 100, a short pulse signal from the PLL clock signal is generated. Step 112 indicates that N delayed signals are generated from the short pulse signal using a multiplexer and a multiplexer counter. Each of the N delayed signals are compared with the PLL clock signal $2^k$ times, where $2^k$ is a predetermined number, in steps 116–136. When the clock signal and the delayed signal are both high, a hit count is generated by the hit counter. Specifically, during steps 126–132, it is determined where both the hit count and the predetermined threshold value are the same and, as a result, the multiplexer counter value is stored. Jitter parameters are calculated in step 138 using the stored multiplexer counter values.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

APPENDIX A

```
library IEEE;
USE IEEE.std_logic_1164.all;
use ieee.std_logic_unsigned."+";
-- ---------------------------------------------------------------
-- ENTITY: I/O Definition
-- ---------------------------------------------------------------
entity Jitter is
port (
    clk_in       : in std_logic;      -- the input clock
    reset_i      : in std_logic;
    tap_no       : out integer range 0 to 127;
    bist_done_o  : out std_logic
    );
end jitter;
architecture rtl of Jitter is
-- ---------------------------------------------------------------
    -- put all signal declarations here
    -- all internal signals
-- ---------------------------------------------------------------
    signal clk_86_I    : std_logic;
              -- clock that is delayed 84% from input clock
    signal clk_86_x_I  : std_logic;
              -- clock that is delayed 84+x% from input clock
    signal clk_delay_in : std_logic;  -- the input to delay
                                         elements
    signal first_time_s : std_logic;
    signal clk_delay    : std_logic_vector (127  -- the delayed
                                            downto 0);
clocks
    signal stat_counter_output_s : integer range 0 to 1023;
    signal nxt_tap_clk_s : std_logic;
    signal mux_counter_output    : integer range 0 to 127;
```

APPENDIX A-continued

```
    signal mux_output     : std_logic;    -- the single mux output
    signal hit_clk_s      : std_logic;
    signal hit_cnt_s      : integer range 0 to 1023;
    signal i              : integer range 0 to 126,
    signal hit_state_s    : std_logic_vector (2 downto 0);
    signal hit_match_s                : std_logic;
    signal no_of_hits_pgm_s : integer range 0 to 1023;
    signal hit_mux_in0_s  : integer range 0 to 1023;
    signal hit_mux_in1_s  : integer range 0 to 1023;
    signal hit_mux_out_s  : integer range 0 to 1023;
    signal hit_mux_sel_s              : std_logic;
    signal bist_done_s    : std_logic;
component ibuf
    port(
        O: out STD_LOGIC;
        I: in STD_LOGIC
    );
end component;
component obuf
    port(
        O: out STD_LOGIC;
        I: in STD_LOGIC
    );
end component;
begin -- rtl
-- clk_86_I <= clk_in after 86 ns;
-- clk_86_x_I <= clk_in after 87 ns;
delay_clk_in_86 : process (clk_in)
    begin -- process stat_counter
        if (clk_in'event) then
--            wait for 86 ns;
            clk_86_I <= transport clk_in after 86 ns;
        end if;
end process delay_clk_in_86;
delay_clk_in_87 : process (clk_in)
    begin -- process stat_counter
        if (clk_in'event) then
--            wait for 86 ns;
            clk_86_x_I <= transport clk_in after 87 ns;
        end if;
end process delay_clk_in_87;
clk_delay_in <= clk_86_I and (not clk_86_x_I);
clk_delay(0) <= clk_delay_in after 1 ns;
dly_elements: for i in 0 to 126 generate
-- begin
    clk_delay(i+1) <= clk_delay(i) after 1 ns;
end generate dly_elements;
-- Statistical counter counts upto a maximum value
-- When it rolls over signals with nxt_tap_clk_s
-- ** Added the asynchronous reset
stat_counter: process (clk_in, reset_i)
begin -- process stat_counter
    if (reset_i = '1') then
        stat_counter_output_s <= 0;
    elsif (clk_in'event and clk_in = '1') then
        if (stat_counter_output_s = 1023) then
            stat_counter_output_s <= 0;   -- reset back the counter
            nxt_tap_clk_s <= '1';
        else
            stat_counter_output_s <= stat_counter_output_s + 1;
            nxt_tap_clk_s <= '0';
        end if;
    end if;
end process stat_counter;
-- purpose : this is the counter to generate the 0 to 127 numbers
-- type : combinational
-- inputs : stat_clk   -- Output of stat counter
-- ** removed hit_state_s from sensitivity list
mux_counter: process (nxt_tap_clk_s,reset_i)
begin -- process mux_counter
if reset_i ='1' then
    mux_counter_output <= 0;
elsif (nxt_tap_clk_s'event and nxt_tap_clk_s = '1') then
    if (bist_done_s = '0') then
        if mux_counter_output = 127 then
            mux_counter_output <= 0;  -- reset back the counter
        else
            mux_counter_output <= mux_counter_output + 1;
        end if;
```

APPENDIX A-continued

```
        elsif (bist_done_s '1') then
            mux_counter_output <= mux_counter_output;
        end if;
    end if;
end process mux_counter;
-- purpose : this is the Tap 0–127 mux with the counter output as its
-- control inputs : counter_output
-- outputs: all the ~128 delay clocks
-- mux: process (mux_counter_output)
-- begin -- process mux
    mux_output <= clk_delay(mux_counter_output);
-- end process mux;
-- AND gate to see of clock falls in that window
hit_clk_s <= mux_output and clk_in;
-- Count the # of hits
-- Think about making it synchronous
hit_counter: process (hit_clk_s, reset_i, nxt_tap_clk_s)
begin -- process hit_counter
        if nxt_tap_clk_s = '1' then
            hit_cnt_s <= 0;
        end if;
    if reset_i ='1' then
        hit_cnt_s <= 0;
    elsif (hit_clk_s'event and hit_clk_s = '1') then
        if hit_cnt_s= 1023 then
            hit_cnt_s <= 0;         -- reset back the counter
        else
            hit_cnt_s <= hit cnt_s + 1;
        end if;
    end if;
end process hit_counter;
hit_mux_in0_s <= hit_cnt_s;
hit_mux_in1_s <= 1023 - hit_cnt_s;
-- Mux after hit counter
process (hit_mux_in0_s, hit_mux_in1_s, hit_mux_sel_s)
begin
    if (hit_mux_sel_s = '1') then
        hit_mux_out_s <= hit_mux_in1_s;
    else
        hit_mux_out_s <= hit_mux_in0_s;
    end if;
end process;
-- And Gate Comparison logic
-- Change the comparison logic so that there is no
-- wait till the end of stat counter to roll over
-- ** Changed to include nxt_tap_clk_s
-- ** Changed the sensitivity list
process (nxt_tap_clk_s)
begin
    if (nxt_tap_clk_s'event and nxt_tap_clk_s = '1') then
        if (hit_mux_out_s >= no_of_hits_pgm_s) then
            hit_match_s <= '1';
            tap_no <= mux_counter_output;
        end if;
    else
        hit_match s <= '0';
    end if;
end process;
-- Advances the state
** Removed hit_match_s from sensitivity list
process (reset_i, clk_in)
begin
    if (reset_i = '1') then
        hit_state_s <= "000";
    elsif (clk_in'event and clk in = '1') then
        if (hit_match_s = '1') then
            if (hit_state_s >= "101") then
                hit_state_s <= hit state_s;
            else
                hit_state_s <= hit_state_s + "001";
            end if;
        else
            hit_state_s <= hit_state_s;
        end if;
    end if;
end process;
-- Defines states
process (hit_state_s)
begin
```

APPENDIX A-continued

```
    if (hit_state_s = "000") then
        no_of_hits_pgm_s <= 10;
        hit_mux_sel_s <= '0';
        bist_done_s <= '0';
    elsif ((hit_state_s = "001") or (hit_state_s = "100")) then
        no_of_hits_pgm_s <= 512;
        hit_mux_sel_s <= '0';
        bist_done_s <= '0';
    elsif (hit_state_s = "011") then
        no_of_hits_pgm_s <= 512;
        hit_mux_sel_s <= '1';
        bist_done_s <= '0';
    elsif (hit_state_s = "010") then
        no_of_hits_pgm_s <= 1023;
        hit_mux_sel_s <= '0';
        bist_done_s <= '0';
    else
        hit_mux_sel_s <= '0';
        bist_done_s <= '1';
    end if;
end process;
bist_done_o <= bist_done_s;
end rtl ;
```

What is claimed is:

1. An integrated circuit having a built-in self test circuit for measuring error of a phase lock loop output clock signal, comprising:

a short-pulse generator coupled to receive the phase lock loop output clock signal to generate a short-pulse signal having the same pulse width as the phase lock loop output clock signal;

a delay chain coupled to receive the short-pulse signal, the delay chain comprising a plurality of delay elements to generate N delayed pulses from the short-pulse signal;

a statistical counter coupled to receive the phase lock loop output clock signal, wherein the statistical counter generates a statistical maximum count 2κ a hit-pulse generator coupled to receive the N delayed pulses to compare each of the N delayed pulses with the phase lock loop output clock signal $2^k$ times, where k is a predetermined number and to generate a hit-pulse when both signals are high and to generate a hit count wherein the hit count is the number of hit pulses;

a first comparator coupled to receive the hit count and at least one predetermined threshold value to compare the hit count for each of the N delayed pulses with the at least one predetermined threshold value;

a storage unit coupled to the first comparator and the hit-pulse generator, such that when the hit count and one of the pre-determined set of threshold values are equivalent, the storage unit stores the value of N; and a processing unit coupled to the storage unit to calculate error of the phase lock loop output clock signal using each stored value of N for each corresponding predetermined threshold value.

2. The integrated circuit chip having a built-in circuit for measuring error of a phase lock loop output clock signal as recited in claim 1 wherein the hit-pulse generator comprises:

a multiplexer having a plurality of inputs and an output, the plurality of inputs coupled to receive the N delayed pulses;

a first counter having a count from 1 to N, the first counter coupled to generate multiplexer count wherein the multiplexer count determines which of the N delayed pulses appears at the output of the multiplexer;

a second comparator coupled to receive the multiplexer output signal and the phase lock loop output clock signal to generate a hit-pulse when both signals are high; and a second counter coupled to the hit-pulse generator to generate a hit count.

3. The integrated circuit chip having a built-in circuit for measuring error of a phase lock loop output clock signal as recited in claim 1 wherein the short-pulse generator comprises:
   a first delay device having an input and an output, the input coupled to receive the phase lock loop output clock signal;
   a second delay device having an input and an output, the input coupled to receive the phase lock loop output clock signal, wherein the delay of the second delay device is larger then the delay of the first delay device; and
   an AND gate having an output, an inverting and non-inverting input, the non-inverting input coupled to the output of the first delay, the inverting input coupled to the output of the second delay, the output of the AND gate to provide the short-pulse signal.

4. The integrated circuit chip having a built-in circuit for measuring error of a phase lock loop output clock signal as recited in claim 2 wherein the second comparator comprises an AND gate having a first and a second input and an output, the first input coupled to the output of the multiplexer, the second input coupled to receive the phase lock loop output clock signal, the AND gate couples to generate the hit-pulse at the output.

5. The integrated circuit chip having a built-in circuit for measuring error of a phase lock loop output clock signal as recited in claim 2 wherein the second comparator comprises:
   an inverter having an input and an output, the input coupled to the output of the hit counter;
   a second multiplexer having a control input, a first and a second input, and an output, the first input coupled to output of the inverter, the second input coupled to the output of the hit counter; and
   an AND gate having a first and second input and an output, the first input coupled to the output of the second multiplexer, the second input coupled to receive the predetermined threshold.

6. The integrated circuit chip having a built-in circuit for measuring error of a phase lock loop output clock signal as recited in claim 1 wherein the error value is the root means square of jitter for the phase lock loop output clock signal divided by the period.

7. The integrated circuit chip having a built-in circuit for measuring error of a phase lock loop output clock signal as recited in claim 1 wherein the error value is the peak-to-peak jitter for the phase lock loop output clock signal divided by the period.

8. The integrated circuit chip having a built-in circuit for measuring error of a phase lock loop output clock signal as recited in claim 1 wherein the error value is the duty ratio.

9. The integrated circuit chip having a built-in circuit for measuring error of a phase lock loop output clock signal as recited in claim 1 wherein N>1000.

10. The integrated circuit chip having a built-in circuit for measuring error of a phase lock loop output clock signal as recited in claim 1 wherein $2^k > 1000$.

11. The integrated circuit chip having a built-in circuit for measuring error of a phase lock loop output clock signal as recited in claim 1 wherein the number of predetermined threshold values is six corresponding to six points, $n_1-n_6$, that map one and a half periods of the cumulative distribution of jitter for the phase lock loop output clock signal, wherein $n_1$ represents the point where the value of threshold is 1 at the start of the rising edge of the first period of the cumulative distribution, $n_2$ represents the point where the value of threshold is $2^k \times 0.5$ on the rising edge of the first period of the cumulative distribution, $n_3$ represents the point where the value of threshold is $2^k \times 0.84$ on the rising edge of the first period of the cumulative distribution, $n_4$ represents the point where the value of threshold is $2^k$ on the rising edge of the first period of the cumulative distribution, $n_5$ represents the point where the value of threshold is $2^k \times 0.5$ on the falling edge of the cumulative distribution, and $n_6$ represents the point where the value of threshold is $2^k \times 0.5$ on the rising edge of the second period of the cumulative distribution.

12. The integrated circuit chip having a built-in circuit for measuring error of a phase lock loop output clock signal as recited in claim 11 wherein the error value is $(n_3-n_2)/(n_6-n_2)$ where $(n_3-n_2)$ represents the root means square of jitter of the phase lock loop output clock signal and $(n_6-n_2)$ represents the period of the phase lock loop output clock signal.

13. The integrated circuit chip having a built-in circuit for measuring error of a phase lock loop output clock signal as recited in claim 11 wherein the error value is $(n_4-n_1)/(n_6-n_2)$ where $(n_4-n_1)$ represents the peak-to-peak jitter of the phase lock loop output clock signal and $(n_6-n_2)$ represents the period of the phase lock loop output clock signal.

14. The integrated circuit chip having a built-in circuit for measuring error of a phase lock loop output clock signal as recited in claim 13 wherein each pulse of the plurality of N delayed pulses are less than one tenth of the peak-to-peak jitter of the phase lock loop output clock signal.

15. The integrated circuit chip having a built-in circuit for measuring error of a phase lock loop output clock signal as recited in claim 11 wherein a duty ratio is $(n_5-n_2)/(n_6-n_2)$ where $(n_5-n_2)$ represents the average phase lock loop output pulse width of the phase lock loop output clock signal and $(n_6-n_2)$ represents the period of the phase lock loop output clock signal.

16. An integrated circuit chip having a built-in circuit for measuring error of a phase lock loop output clock signal, comprising:
   a first delay device having an input and an output coupled to receive the phase lock loop output clock signal;
   a second delay device having an input and an output coupled to receive the phase lock loop output clock signal, wherein the delay of the second delay device is larger then the delay of the first delay device;
   a first AND gate having an inverting and non-inverting input, the non-inverting input coupled to the output of the first delay, the inverting input coupled to the output of the second delay;
   a sorting circuit that includes a plurality of delay elements for creating N delayed pulses from the output of the first AND gate;
   a first multiplexer having a plurality of input signals and an output, the plurality of inputs coupled to receive the N delayed pulses;
   a first counter coupled to receive the phase lock loop output clock, wherein the first counter generates a statistical maximum count;
   a second counter having a control input and an output, the control input coupled to receive the statistical maximum count to generate a multiplexer count, the output of the second counter coupled to the first multiplexer;

a second AND gate having a first and a second input and an output, the first input coupled to the output of the multiplexer, the second input coupled to receive the phase lock loop output clock signal;

a third counter having a control input, an input and an output, the control input coupled to receive the statistical maximum count, the input of the third counter coupled to the output of the second AND gate;

an inverter coupled to the output of the third counter;

a second multiplexer having a control input, a first and a second input, and an output, the first input coupled to the inverter, the second input coupled to the output of the third counter;

a third And gate having a first and second input and an output, the first input coupled to the output of the second multiplexer, the second input coupled to receive a predetermined threshold;

a storage unit having a control input coupled to the output of the third AND gate, and an input coupled to receive the multiplexer count; and a processing unit coupled to the storage unit to calculate error of the phase lock loop output clock signal.

17. A method for measuring jitter in a signal comprising the steps of:

generating a short pulse signal from the signal;

generating N delayed signals from the short pulse signal using a multiplexer and a multiplexer counter;

generating a statistical maximum count 2κ using a statistical counter;

comparing each of the N delayed signals with the signal $2^k$ times, where $2^k$ is a predetermined number;

generating a hit count with a hit counter when both the clock signal and the delayed signal are high;

comparing the hit count for each of the N delayed signals with a predetermined threshold value;

storing the multiplexer counter value when both the hit count and the predetermined threshold value are equal; and calculating error from the stored multiplexer counter values.

18. The method of claim 17 wherein the error includes the root means square of jitter for the phase lock loop output clock signal divided by the period.

19. The method of claim 17 wherein the error includes the peak-to-peak jitter for the phase lock loop output clock signal divided by the period.

20. The method of claim 17 wherein the error includes the duty ratio.

* * * * *

UNITED STATES PATENT AND TRADEMARK OFFICE
CERTIFICATE OF CORRECTION

PATENT NO. : 6,661,266 B1  Page 1 of 1
APPLICATION NO. : 09/708994
DATED : December 9, 2003
INVENTOR(S) : Pramodchandran N. Variyam et al.

It is certified that error appears in the above-identified patent and that said Letters Patent is hereby corrected as shown below:

On title page Item [56] insert
--Claim priority from provisional application number 60/199,018 filed April 20, 2000.--

Signed and Sealed this

Eighth Day of April, 2008

JON W. DUDAS
*Director of the United States Patent and Trademark Office*